United States Patent [19]
Asahina et al.

[11] Patent Number: 6,144,097
[45] Date of Patent: Nov. 7, 2000

[54] SEMICONDUCTOR DEVICE AND METHOD OF FABRICATING THE SAME

[75] Inventors: Michio Asahina, Sakata; Junichi Takeuchi, Chino; Naohiro Moriya, Sakata; Kazuki Matsumoto, Chino, all of Japan

[73] Assignee: Seiko Epson Corporation, Tokyo, Japan

[21] Appl. No.: 09/220,590

[22] Filed: Dec. 28, 1998

[30] Foreign Application Priority Data

May 13, 1998 [JP] Japan .................................. 10-148359

[51] Int. Cl.[7] .......................... H01L 23/48; H01L 23/52; H01L 29/40
[52] U.S. Cl. .......................... 257/751; 257/763; 257/764; 257/771; 257/774; 438/627; 438/643; 438/653; 438/927
[58] Field of Search ..................................... 257/751, 763, 257/764, 771, 774; 438/627, 643, 653, 927

[56] References Cited

U.S. PATENT DOCUMENTS 5,502,334  3/1996  Shinohara ................................ 257/751
5,561,326  10/1996 Ito et al. .................................. 257/751
5,918,149  6/1999  Besser et al. ........................... 438/680
5,985,759  11/1999 Kim et al. ............................... 438/653

FOREIGN PATENT DOCUMENTS

9-314518  12/1997  Japan .

Primary Examiner—David Hardy
Assistant Examiner—Jhihan B. Clark
Attorney, Agent, or Firm—Oliff & Berridge, PLC

[57] ABSTRACT

A semiconductor device comprising a semiconductor substrate including an electronic element, interlayer dielectric (silicon oxide layer and BPSG layer) formed on the semiconductor substrate, a contact hole formed in the interlayer dielectric, a barrier layer formed on the interlayer dielectric and contact hole, and a wiring layer formed on the barrier layer. In the barrier layer, metal oxide (titanium oxide) are scattered in an island-like configuration. The barrier layer is formed by depositing a layer that is used to form the barrier layer and then introducing oxygen into the layer. The step is achieved by depositing a layer for the barrier layer, exposing the layer in oxygen plasma under reduced pressure, and subjecting the layer to the thermal processing, or, alternatively by depositing a layer for the barrier layer and subjecting the layer to thermal processing in an atmosphere of oxygen. The semiconductor device of the present invention has a barrier layer with excellent barrier properties.

20 Claims, 6 Drawing Sheets

SEMICONDUCTOR DEVICE AND METHOD OF FABRICATING THE SAME

BACKGROUND OF THE INVENTION

1. Field of the Invention

The present invention relates generally to a semiconductor device and a method of fabricating the same, and, more particularly, to a semiconductor device having a barrier layer with excellent barrier properties and a method of fabricating the same.

2. Description of Related Art

In semiconductor devices such as LSIs, recent advances in miniaturization, integration, and multi-layering of electronic elements have required contact holes having a large aspect ratio. It is difficult to embed wiring materials into such contact holes, and this has become an important technical problem in recent years. Therefore, attempts have been made to embed aluminum or an aluminum alloy which is useful as a wiring material into the contact holes.

A barrier layer is important to prevent an electromigration caused by aluminum wiring, or a reaction between aluminum and a silicon substrate. In particular, the barrier properties in a barrier layer should be improved sufficiently when aluminum is embedded in a contact hole.

SUMMARY OF THE INVENTION

It is an object of the present invention to provide a semiconductor device including a barrier layer with excellent barrier properties and a method of fabricating the same.

According to a first aspect of the present invention, there is provided a semiconductor device comprising: a semiconductor substrate including an electronic element; an interlayer dielectric formed on said semiconductor device; a contact hole formed on said interlayer dielectric; a barrier layer formed on said interlayer dielectric and said contact hole; and a wiring layer formed on said barrier layer, wherein said barrier layer includes metal oxide scattered in an island-like configuration.

Because the barrier layer in this semiconductor device includes metal oxide scattered in an island-like configuration, the barrier properties of the barrier layer can be improved as compared with those of a barrier layer without the metal oxide.

The reason is supposed to be as follows. Conventionally, a barrier layer including titanium, for example, has been considered to be in an amorphous state. However, according to the research conducted by the inventors of the present invention, it was found that the barrier layer in the present invention has crystal particles of titanium oxide ($TiO_2$) scattered randomly like isles in a titanium nitride layer with a disturbed crystal structure. Titanium oxide is an almost complete insulator, in which a metal such as aluminum is diffused with great difficulty. Such particles of titanium oxide scattered like isles in a barrier layer disturbs the crystal structure of the titanium nitride included in the barrier layer, so that diffusion of aluminum through particle boundary (boundary between crystal particles) can be obstructed. As a result, the barrier properties of a barrier layer can be significantly improved. This will occur similarly even when the barrier layer includes metal such as cobalt or tungsten.

The metal oxide included in the barrier layer does not affect electrical conductivity of the barrier layer because the metal oxide is scattered like isles in the barrier layer. In other words, particles of the metal oxide in the barrier layer should be scattered in order not to affect the electrical conductivity of the barrier layer.

The metal oxide included in the barrier layer may have an average particle diameter of 2 to 20 nm, when the barrier properties and electrical conductivity are taken into consideration.

The barrier layer may include at least one substance selected from a group consisting of titanium, cobalt, tungsten, and nitrides of these metals. In particular, the barrier layer may have a multilayered structure including a metal layer of titanium, cobalt, or tungsten and a metal nitride layer. For example, when a barrier layer includes a titanium layer and a titanium nitride layer, a contact portion between the wiring layer and an impurity diffusion layer in the substrate substantially comprises a titanium silicide layer, titanium nitride crystal layer, and titanium nitride layer with a disturbed crystal structure caused by titanium oxide particles scattered like isles.

Furthermore, gaseous components of the interlayer dielectric may be removed by thermal processing. Although the reason will be discussed later, a contact portion formed of an aluminum layer or an aluminum based alloy layer having an excellent step coverage can be formed by removing the gaseous components from the interlayer dielectric.

According to a second aspect of the present invention, there is provided a method of fabricating a semiconductor device comprising the steps of:

(a) forming a contact hole in an interlayer dielectric formed on a semiconductor substrate including an electronic element;

(b) forming a layer that is used to form a barrier layer on said interlayer dielectric and said contact hole;

(c) forming said barrier layer by introducing oxygen into said layer that is used to form said barrier layer to cause metal oxide included in said layer to be scattered in an island-like configuration;

(d) cooling said semiconductor substrate to 100° C. or lower;

(e) forming a first aluminum layer made of aluminum or an aluminum based alloy at a temperature of 200° C. or lower on said barrier layer, and (f) forming a second aluminum layer made of aluminum or an aluminum based alloy at a temperature of 300° C. or higher on said first aluminum layer.

By the step (c), the barrier layer having metal oxide scattered in an island-like configuration can be provided. A first method of carrying out the step (c) comprises depositing a layer that is used to form the barrier layer, exposing the layer to an oxygen plasma under reduced pressure, and then thermally processing the layer. A second method comprises depositing the layer that is used to form the barrier layer and then thermally processing the layer in an oxygen atmosphere.

In addition, the method of fabricating the semiconductor device may further comprise a degassing step (g) in which gaseous components in said interlayer dielectric are removed by thermal processing at the substrate temperature of 300° C. to 550° C. under a reduced pressure, after said step (a). By the step (g) of removing gaseous components in the interlayer dielectric in this way, a generation of gases such as water, nitrogen, hydrogen, or oxygen included in the interlayer dielectric can be restrained in the following step (f) of forming the second aluminum layer performed at a temperature of 300° C. or more, for example.

The inventors of the present invention have confirmed that the gases generated from such interlayer dielectric are absorbed in a barrier layer, but cannot be absorbed in an aluminum layer within a contact hole. Therefore, deterioration of wettability and occurrence of voids in the barrier layer due to the presence of such gases between the barrier layer and first aluminum layer can be restrained with certainty by removing the gaseous components included in the interlayer dielectric according to the step (g). As a result, a contact portion composed of an aluminum layer with an excellent coverage and low electric resistance can be formed in the contact hole.

In the present invention, "gaseous components," refers to gas ingredients such as water, hydrogen, oxygen, and nitrogen generated from a deposition layer, i.e. an interlayer dielectric or barrier layer, for example, when a substrate temperature is 300° C. or more under reduced pressure. The term "reduced pressure" refers to a pressure in the range preferably from 0.1 to 1 Pa.

In the present invention, the substrate is cooled to 100° C. or lower, preferably to a temperature in the range from room temperature to 50° C., in the step (d) described above. By cooling the substrate in this step (d), the substrate temperature can be lowered sufficiently prior to the formation of the first aluminum layer. Because the substrate is subjected to a high temperature of 300° C. or higher in the degassing step (g), lowering the substrate temperature with certainty in this step (d) ensures the temperature control in the subsequent step (e).

By forming a first aluminum layer on the barrier layer in the step (e) at a temperature of 200° C. or lower, preferably in the range from 30 to 100° C., the gasification of the components included in the interlayer dielectric and barrier layer can be suppressed, whereby deterioration of wettability in the barrier layer due to gases generated from the barrier layer can be prevented. Consequently, the first aluminum layer can adhere well to the barrier layer, ensuring formation of layers with an excellent step coverage.

This first aluminum layer can restrain the generation of gases from the interlayer dielectric and barrier layer below the first aluminum layer, even if the substrate temperature is increased. Thus, a second aluminum layer can be formed in the step (f) at a relatively high temperature, that is, in a range in which aluminum or aluminum alloy can flow and diffuse, more specifically, 300° C. or above, preferably, in the range from 350 to 450° C.

In this manner, an excellent step coverage without generation of voids can be embedded into a contact hole by forming the first aluminum layer at a relatively low temperature in the step (e) and forming the second aluminum layer at a relatively high temperature in the step (f). Note that the fabrication method of the present invention has been confirmed to be applicable to a contact hole having a diameter of 0.2 μm.

Forming of aluminum layers in the steps (e) and (f) may be performed by sputtering, and forming of the first and second aluminum layers may be performed continuously in the same chamber. Such continuous formation of aluminum layers in the same chamber ensures not only easy control of the substrate temperature, but also exact control of the atmosphere, whereby occurrence of such a disadvantage as formation of an oxide layer on the first aluminum layer can be avoided.

The contact structure of the present invention can be advantageously applied to a silicide layer formed on an impurity diffusion layer forming a source region or drain region. However, the application of the contact structure is not limited to this. The structure can also be applied to contact of other regions or impurity diffusion layers without a silicide layer, for instance.

The contact hole of the present invention can be formed not only by anisotropic dry-etching, but also by a combination of isotropic wet-etching and anisotropic dry-etching to have an appropriate tapered shape at the upper end portion of the contact hole. In the latter case, when a lower portion of a contact hole of this type formed by anisotropic dry-etching has a diameter of 0.5 to 0.8 μm and an aspect ratio of 0.5 to 3 for example, the second aluminum layer can be formed at a temperature in the range from 300 to 350° C. This allows the use of a standard type sputtering apparatus instead of a sputtering apparatus with a high temperature specification to form the contact hole. Thus, the contact hole of the present invention is useful in practice.

DESCRIPTION OF PREFERRED EMBODIMENTS

Figure 1A:
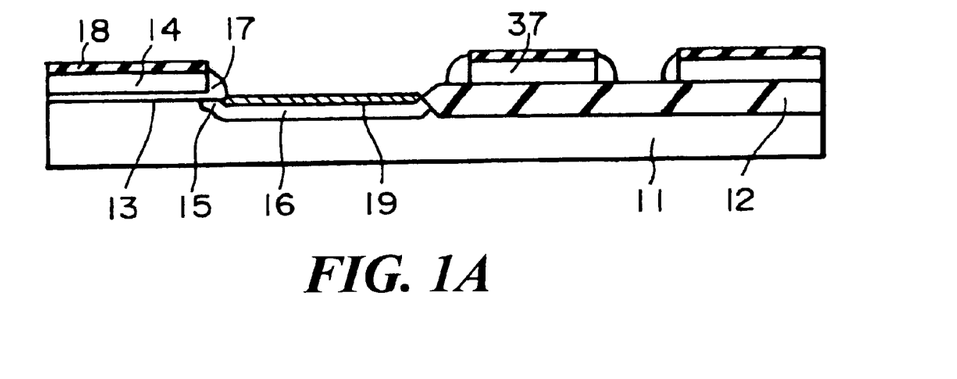
FIGS. 1A, 1B, and 1C are schematic cross-sectional views showing the processing sequence in an example of the method of fabricating a semiconductor device in accordance with the present invention.
Figure 1B:
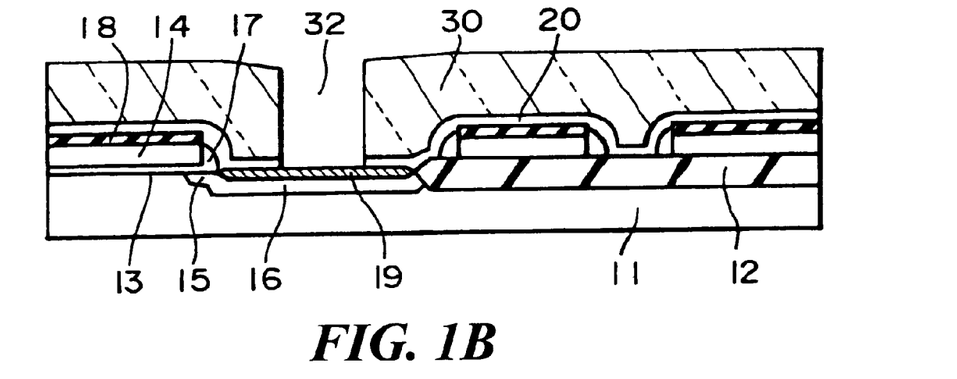
Figure 1C:
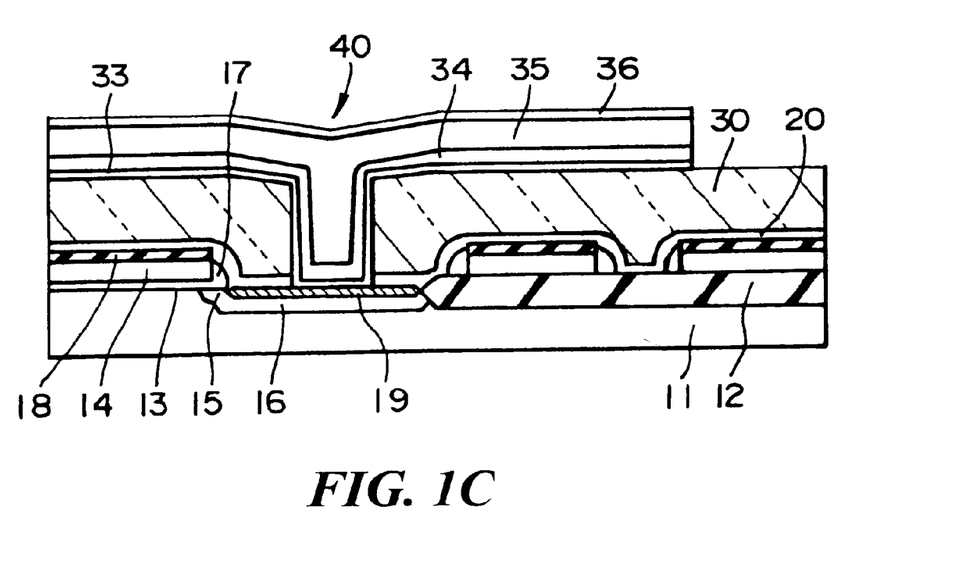

FIGS. 1A, 1B and 1C are schematic cross-sectional views which illustrate an embodiment of the method of fabricating a semiconductor device and a resultant semiconductor device in accordance with the present invention.

An example of this method of fabricating a semiconductor device will be described below.

A. Fabrication of Electronic Element

A MOS element is first formed on a silicon substrate 11 by a generally used method. More specifically, a field insulation layer 12 is formed on the silicon substrate 11 by selective oxidation and a gate oxide layer 13 is formed in an active region thereof, by way of example. After the threshold voltage has been adjusted by channel implantation, monosilane ($SiH_4$) is thermally decomposed to grow a polysilicon layer, then tungsten silicide is formed by sputtering on that polysilicon layer. A silicon oxide layer 18 is superimposed thereon, and this is etched to a predetermined pattern to form a gate electrode 14. At the same time, a wiring layer 37 is formed from the polysilicon layer and tungsten silicide layer on the field insulation layer 12, if necessary.

A low-concentration impurity layer 15 for the source or drain region is then formed by the implantation of phosphorus ions. After a side-wall spacer 17 has been formed from the silicon oxide layer on the sides of the gate electrode 14, arsenic ions are implanted, and these impurities are activated by annealing using a halogen lamp to form a high-concentration impurity layer 16 for the source or drain region.

A silicon oxide layer having a thickness of not more than 100 nm is then formed by vapor deposition, and a predetermined silicon substrate region is exposed by selectively etching this layer in a mixed aqueous solution of hydrogen fluoride (HF) and $NH_4F$. Subsequently, for example, a titanium monosilicide layer is formed on the surface of the exposed silicon substrate and a titanium-rich titanium nitride (TiN) layer is formed on the silicon oxide layer 18 by sputtering titanium to a thickness of approximately 30 to 100 nm and by rapid annealing for approximately a few seconds to 60 seconds at a temperature of 650° C. to 750° C. in a nitrogen atmosphere in which oxygen is controlled to be not more than 50 ppm. The wafer is then immersed in a mixed aqueous solution of ammonium hydroxide ($NH_4OH$) and hydrogen peroxide ($H_2O_2$) to etch away the titanium nitride layer, leaving the titanium monosilicide layer only on the surface of the silicon substrate. Lamp annealing at 750° C. to 850° C. is then performed to convert the monosilicide layer to a disilicide, so that the titanium silicide layer 19 is formed in a self-aligned manner on the surface of the high-concentration impurity layer 16.

Note that if the gate electrode 14 is formed of polysilicon alone and it is exposed by selective etching, a titanium salicide structure is formed where the gate electrode is separated by side-wall spacers from both of the source and drain regions.

B. Formation of Interlayer Dielectric

First of all, as an interlayer dielectric, the silicon oxide layer 20 having a thickness of 100 to 200 nm is formed by causing tetraethoxysilane (TEOS) and oxygen to plasma react. This silicon oxide layer 20 forms an extremely fine layer with better insulating properties than a layer grown from monosilane ($SiH_4$) and with a slower etching speed with respect to an aqueous hydrogen fluoride solution, and without any oxidation or cusping of the silicide layer 19.

In this case, the silicon oxide layer is formed directly on the titanium silicide layer 19. If the layer-formation temperature is high during this time, the oxidizing gases will react with the titanium silicide in the initial stages of the layer formation, making cracking and peeling likely to occur, so the processing temperature is preferably 600° C. or less, or more preferably between 250° C. to 400° C. Once the silicon oxide layer has been formed to a thickness of approximately 100 nm on the titanium silicide layer 19 at this comparatively low temperature, raising the temperature to approximately 900° C. for annealing or vapor-phase oxidation performed in a non-steam oxidizing atmosphere will not cause any problems.

Next, as an interlayer dielectric, there is formed a Boron-Phosho-Silicate Glass (BPSG) layer 30 having a thickness of approximately hundreds nm to 1 μm on the silicon oxide layer 20, by a vapor-phase reaction of a silane compound such as $SiH_4$ or TEOS, and gases containing oxygen, ozone, phosphorus, and boron. Then, the wafer is annealed in a nitrogen atmosphere at a temperature of 800 to 900° C. to be flattened by a high temperature flow. Flattening may be performed by utilizing a commonly-used Spin-On-Glass (SOG) layer, instead of the high temperature flow of the BPSG layer 30.

In addition, instead of the BPSG layer 30, a silicon oxide layer (hereinafter referred to as "a first silicon oxide layer") that is formed by using a chemical vapor deposition method to cause a silicon compound and hydrogen peroxide to react, as described in patent applications filed by the applicant of the present invention such as Japanese Patent Application No. 9-314518, may also be used. The silicon oxide layer is inherently highly fluid and has superior self-flattening characteristics. The mechanism is considered to be due to the fact that, when a silicon compound and hydrogen peroxide are made to react by a chemical vapor deposition method, silanol will be formed in vapor phase, and the deposition of the resultant silanol on a wafer surface causes the formation of a layer having a high degree of fluidity. A summary with respect to the technique of this silicon oxide layer will now be described.

When monosilane is used as the silicon compound, for example, the reactions given by Reaction Formulas 1 and 1' below result in the formation of silanol:

Formula 1: $SiH_4 + 2H_2O_2 \rightarrow Si(OH)_4 + 2H_2$

Formula 1': $SiH_4 + 3H_2O_2 \rightarrow Si(OH)_4 + 2H_2O + H_2$

The silanol formed in accordance with Reaction Formulas 1 and 1' desorbs water by the polycondensation reaction of Reaction Formula 2, to form silicon oxide.

Formula 2: $Si(OH)_4 \rightarrow SiO_2 + 2H_2O$

Examples of silicon compounds that could be used are inorganic silane compounds such as monosilane, disilane, $SiH_2Cl_2$, and $SiF_4$, and organic silane compounds such as $CH_3SiH_3$, tripropylsilane and tetraethoxysilane.

The formation step of this silicon oxide layer is preferably performed by the reduced pressure chemical vapor deposition method under temperature conditions of 0° C. to 20° C. if the silicon compound is an inorganic silicon compound, or under temperature conditions of 100° C. to 150° C., if the silicon compound is an organic silicon compound. If the temperature of this formation step is higher than the above maximum value, the polycondensation reaction of Reaction Formula 2 proceeds too fast, reducing the fluidity of the first silicon oxide layer and making it difficult to obtain a good flatness. If the temperature is lower than the above minimum value, the disassociated moisture will be adsorbed within the chamber and condensation will occur outside of the chamber, making it difficult to control the fabrication apparatus.

The first silicon oxide layer is preferably formed to a sufficient thickness to cover any gaps in the surface of the silicon substrate. The minimum thickness of the first silicon oxide layer depends on the height of any unevenness in the surface of the silicon substrate comprising the electronic element, but this thickness is preferably 300 to 1000 nm. If the thickness of the first silicon oxide layer exceeds that maximum value, stresses in the layer itself will cause cracks to occur.

It is desirable to cause silicon compounds, at least one substance selected from oxygen and compounds comprising oxygen, and an impurity to react by the chemical vapor deposition to form a porous second silicon oxide layer on the first silicon oxide layer.

Not only does this second silicon oxide layer function as a capping layer, its porosity also allows any gaseous components that are generated from the first silicon oxide layer to escape. In addition to being porous, by adding an impurity such as phosphorus or boron, preferably phosphorus, this second silicon oxide layer can relieve stresses within that layer by weakening the strength of bonds between Si and O molecules of the silicon oxide of that layer. A further important role of this second silicon oxide layer is that the impurity, such as phosphorus, within the silicon oxide layer functions as a getter of mobile ions, such as alkali ions, that have an adverse effect on the reliability of the electronic element. The concentration of the impurity within the second silicon oxide layer is preferably 1 to 6 wt % considering from the viewpoints of this gettering function and stress relaxation in the layer.

The second silicon oxide layer has a compressive stress of 100 to 600 MPa, so it has the function of preventing any increase in the tension stresses that occur in the first silicon oxide layer during the polycondensation, thus preventing cracking. This second silicon oxide layer has the further function of preventing the absorption of moisture by the first silicon oxide layer.

The second silicon oxide layer is preferably formed by a plasma chemical vapor deposition method under a temperature condition of 300° C. to 450° C. and at a high frequency of 1 MHz or less. Forming the layer under these temperature conditions makes it easy for gaseous components to escape in the initial stages of subsequent annealing step, further improving the reliability of the device.

The compound comprising oxygen that is used in the step of forming the second silicon oxide layer is preferably dinitrogen monoxide ($N_2O$). The use of dinitrogen monoxide as the reaction gas makes it possible to encourage the desorption of gaseous components (hydrogen and water) within the first silicon oxide layer during the formation of the second silicon oxide layer, because dinitrogen monoxide in a plasma state is easy to react with the hydrogen bonds (—H) in the silicon compound of the first silicon oxide layer. Instead of a plasma chemical vapor deposition method, the second silicon oxide layer could be performed by a normal-pressure chemical vapor deposition method under a temperature condition of 300° C. to 550° C. In such a case, the compound comprising oxygen is preferably ozone.

It is also preferable to expose the first silicon oxide layer to an ozone atmosphere before the second silicon oxide layer is formed. Such exposure encourages the desorption of hydrogen and water from the first silicon oxide layer because ozone is easy to react with the hydrogen bonds (—H) or hydroxyl groups (—OH) in the silicon compound of the first silicon oxide layer.

The thickness of the second silicon oxide layer is determined from considerations of flatness and crack prevention, and is preferably at least 100 nm.

After the first and second silicon oxide layers are formed, performing the annealing at a temperature of 600° C. to 850° C. makes the first and second silicon oxide layers more fine-grained and improves the insulating properties and moisture resistance thereof. In other words, as seen from the first silicon oxide layer, the polycondensation reaction defined by Reaction Formula 2 is completed in the initial stages of this annealing and the water and hydrogen generated by this reaction are released to the outside through pores in the second silicon oxide layer, so that the first silicon oxide layer is formed to be fine-grained in a state in which the gaseous components have been thoroughly removed therefrom. In addition, the second silicon oxide layer is converted from a porous state to a fine-grained one by this annealing.

By setting the temperature to at least 600° C. in this annealing, it is possible to make the first and second silicon oxide layers sufficiently fine-grained, and it is possible that the impurities in the source and drain diffusion layers of the MOS element can be sufficiently activated. Setting this annealing temperature to not more than 850° C. makes it possible to flatten the interlayer dielectric at a temperature that is lower than that necessary for a conventional art BPSG layer, and also ensures that the first and second silicon oxide layers are sufficiently fine-grained. An annealing temperature in excess of 850° C. causes problems such as an unnecessary broadening of the source and drain diffusion layers leading to punch-through, which makes it difficult to miniaturize the electronic element.

Forming a porous second silicon oxide layer on the first silicon oxide layer ensures that the second silicon oxide layer has a suitable flexibility during the annealing, even if there is an rapid temperature change as that is when the wafer is directly put under a temperature from 600° C. to 850° C., so it can absorb the stresses of the first silicon oxide layer and thus the annealing can be performed without any cracks occurring in the first silicon oxide layer.

Formation of Contact Hole

The BPSG layer 30 and silicon oxide layers 20 forming the interlayer dielectric are then selectively and anisotropically etched by a reactive ion etcher using $CHF_3$ and $CF_4$ as main gases, to form a contact hole 32 having a diameter of between 0.2 and 0.5 µm.

C. Degassing

The thermal processing that includes a degassing step will now be described.

Lamp heating (thermal processing A) is performed in a lamp chamber for 30 to 60 seconds at a base pressure of $1.5 \times 10^{-4}$ Pa or less and a temperature of 150° C. to 250° C. Then a degassing is performed by thermal processing (degassing step: thermal processing B) for 30 to 120 seconds at a temperature of 300° C. to 550° C. in a separate chamber into which argon is introduced at a pressure of $1 \times 10^{-1}$ to $15 \times 10^{-1}$ Pa.

During this procedure, the first thermal processing A heats the entire wafer, including the rear and side surfaces thereof, to enable the removal of any moisture or the like adhering to the wafer.

The subsequent thermal processing B makes it possible to remove gaseous components (oxygen, hydrogen, water and nitrogen), mainly from within the BPSG layer 30 forming the interlayer dielectric. As a result, the generation of gaseous components from the BPSG layer during the subsequent step for forming the barrier and aluminum layers can be prevented.

In the present embodiment, a barrier layer 33 is formed of a multilayer which comprises a barrier film having a barrier function, and a conductive film. The conductive film is formed between the barrier film with a high resistance and the impurity diffusion layers formed on the silicon substrate to increase the conductivity with the source region or drain region. It is preferable that an ordinary substance, for example nitride such as titanium or cobalt, is used as the barrier film. A refractory metal such as titanium or cobalt can be used as the conductive film. This titanium or cobalt reacts with the silicon of the substrate to form a silicide.

Since the barrier layer has gaseous components (oxygen, hydrogen, water, and nitrogen) in solid solution therein, which can be several tens of atom% in titanium nitride or titanium layer, removing the gaseous components from the BPSG layer 30 of the interlayer dielectric, before the layer is formed, is extremely effective for forming a good aluminum layer within the contact hole. If the gaseous components in the BPSG layer underlying the barrier layer are not removed sufficiently, the gaseous components within the BPSG layer will be released at the temperature achieved during the formation of the barrier layer (ordinarily: 300° C. or more), and these gases will be taken up into the barrier layer. In addition, these gases will be desorbed from the barrier layer and will exit from the boundary surface with the aluminum layer during the formation of the aluminum layer, which will have adverse effects on the adhesiveness and fluidity of the aluminum layer.

Formation of Barrier Layer

A titanium layer is formed by sputtering to a thickness of 20 to 70 nm, as the conductive film of the barrier layer 33, then a titanium nitride film is formed in a separate chamber to a thickness of 30 to 150 nm, as the barrier film. The temperature for the barrier layer formation depends on the thickness thereof, but is selected to be within the range of 200° C. to 450° C.

The wafer is then exposed to an oxygen plasma at a pressure of $0.1 \times 10^2$ Pa to $1.5 \times 10^2$ Pa for 10 to 100 seconds, then it is annealed in a nitrogen or hydrogen atmosphere at 450° C. to 700° C. for 10 to 60 minutes so that titanium oxide is formed like islands in the barrier layer. This processing has been verified to improve the barrier capabilities of the barrier layer.

Titanium oxide can also be formed in the barrier layer in an island-like configuration by performing thermal processing at a temperature of 400° C. to 800° C. in a lamp annealing furnace containing at least from several hundreds ppm up to several percentages of oxygen. This procedure can also improve the barrier capabilities of the barrier layer.

Although the present embodiment has been described with titanium oxide as a metal oxide distributed in the barrier layer, the oxide of any other metal such as, for example, cobalt or tungsten, can also be used in the barrier layer.

In a case of cobalt, a barrier layer with cobalt oxide scattered like islands in a cobalt nitride layer can be formed by forming a cobalt layer having a thickness of 5 to 30 nm and the cobalt nitride layer having a thickness of 20 to 100 nm using sputtering in different chambers and subsequently by applying thermal processing similar to the case using titanium described above. This barrier layer has also been verified to provide the excellent barrier capabilities. Moreover, it has been confirmed that a similar structure and function can also be obtained when using tungsten.

In addition, a wetting layer such as a titanium layer may be formed after the barrier layer has been formed, but prior to the wafer cooling step described below.

Thermal Processing and Wafer Cooling before Formation of Aluminum Layers

Before the wafer is cooled, further thermal processing (thermal processing C) is performed in the lamp chamber at a base pressure of $1.5 \times 10^{-4}$ Pa or less and a temperature of 150° C. to 250° C. for 30 to 60 seconds, to remove substances such as water that may be adhering to the substrate. After that, but before the aluminum layers are formed, the temperature of the substrate is lowered to 100° C. or lower, preferably to between room temperature and 50° C. This cooling step is important for lowering the substrate temperature that has been increased by the thermal processing C and could be performed by, for example, placing the wafer on a stage that has a water-cooling function and lowering the temperature of the wafer to a predetermined temperature thereby.

This cooling of the wafer ensures that only an extremely small amount of gas escapes from the BPSG layer 30, the barrier layer 33, and all the surfaces of the wafer in the formation step of the first aluminum layer. As a result, the effects of harmful gases adsorbed at the boundary surface between the barrier layer 33 and a first aluminum layer 34 on the coverage and adhesiveness can be prevented.

It is desirable that this cooling step be performed by utilizing the sputtering apparatus for forming aluminum layers which has plural chambers of the same structure. For example, it is desirable that a substrate be placed on a stage of the sputtering apparatus that has a water-cooling function and the temperature of the substrate is lowered to a predetermined temperature. The cooling step will be described in more detail hereinafter.

Figure 2A:
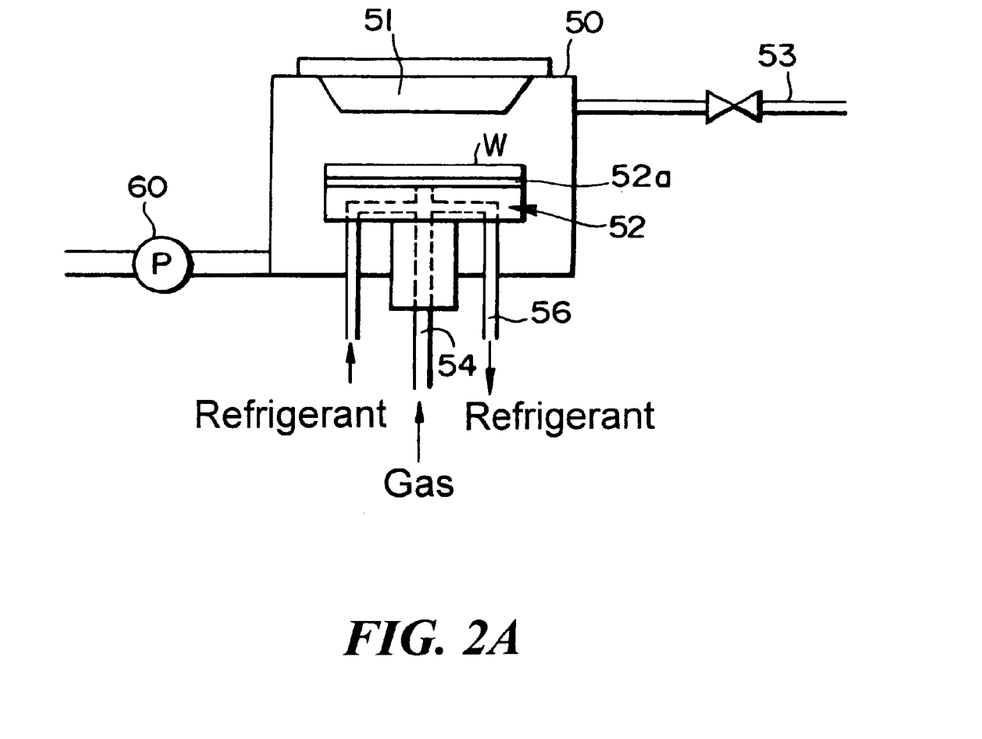
FIG. 2A is a schematic view of an example of a sputtering apparatus used in the embodiment of the present invention.
Figure 2B:
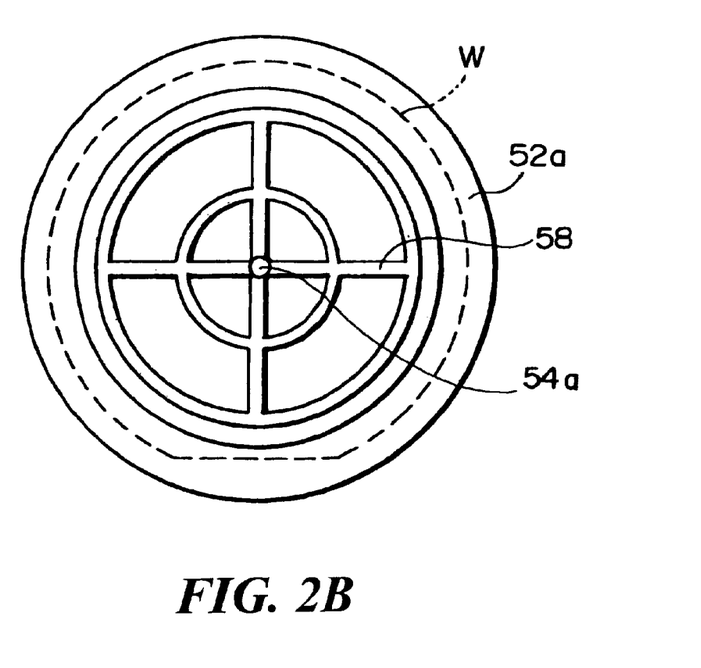
FIG. 2B shows an example of a stage of the sputtering apparatus.

FIG. 2A shows a schematic view of an example of a sputtering apparatus equipped with a stage having a water-cooling function, and FIG. 2B shows a plan view of an example of the stage.

This sputtering apparatus is provided with a plurality of chambers 50 of the same configuration. In the chamber 50, a target 51 which doubles as an electrode and an electrode 52 which doubles as a stage are included, and a wafer W to be cooled is placed on the electrode 52. The chamber 50 is equipped with an exhaust means 60 for reducing the pressure inside the chamber and a first gas supply path 53 for supplying a gas into the chamber when aluminum is sputtered. The electrode 52 is provided with a projection-shaped support portion 52a along an outer periphery of an upper surface of the electrode 52, as shown specifically in FIG. 2B, in order to generate a predetermined space between the electrode 52 and wafer W when the wafer W is placed on the electrode 52. Furthermore, a second gas supply path 54 is connected to the electrode 52. A gas as a thermal conduction medium, e.g., argon gas, is supplied from the second gas supply path 54 to a space between the electrode 52 and wafer W. In addition, the electrode 52 doubles as a cooling system for cooling the wafer W. The electrode 52 is adjusted to a constant temperature by circulation of a refrigerant, such as water, supplied from a refrigerant supply path 56. Grooves 58 are formed in a predetermined pattern in the upper surface of the electrode 52, as shown in FIG. 2B, in order to supply a gas equally to the space described above, and a blow-out port 54a of the second gas supply path 54 is provided at a position where the grooves intersect.

The sputtering apparatus described above operates in the following manner to cool the wafer.

The pressure inside of the chamber 50 is reduced to $6 \times 10^{-6}$ Pa or lower by the exhaust means 60, and subsequently the wafer W is placed on the support portion 52a of the electrode 52. The gas as a thermal conduction medium between the electrode 52 and wafer W is introduced from the second gas supply path 54 to the space between the electrode 52 and wafer W. The wafer W is cooled while the pressure in the space is kept between 600 and 1000 Pa and the gas leaked out into the chamber is exhausted by the exhaust means 60.

A certain degree of pressure in the space between the electrode 52 and wafer W is necessary in order to maintain cooling efficiency when the wafer is cooled. That is, it is necessary to improve the thermal conductance between the electrode 52 and wafer W in order to enhance the cooling efficiency of the wafer W. Also, for this enhancement, it is necessary to increase the pressure of the gas (thermal conduction medium) in the space between the electrode 52 and wafer W.

It is conceivable as a method for cooling a wafer that the wafer be placed on a stage having a cooling mechanism in a chamber to cool the wafer. According to this cooling step, a gas is not supplied directly into a space between the stage and wafer, but the pressure in the space is caused to be dependent on the pressure in a chamber, so that the pressure inside the chamber must be increased in order to increase the pressure in the space between the stage and wafer. However, if the pressure in the chamber is increased in order to increase the cooling efficiency, there will be a greater number of molecules of gas in the chamber, so that the upper surface of the wafer W is likely to be contaminated by the molecules of the gas, resulting in an adverse effect on the reflow of aluminum to cause generation of voids and a high resistance in the wiring. On the contrary, when the pressure in the chamber is decreased in order to prevent the contamination of the wafer, the pressure in the space between the wafer and stage is also lowered. As a result, this causes the thermal conductance between the wafer and stage to drop, resulting in an adverse effect on the cooling efficiency.

According to the present embodiment, the pressure in the space between the electrode 52 and wafer W is ensured by introducing a gas into the space between the electrode 52 and the rear face of the wafer W, so that the pressure in the space can be controlled independently from that in the chamber. Moreover, by maintaining the pressure of the thermal conduction medium between the wafer and stage at a predetermined value, the pressure in the chamber can be suppressed to between $1 \times 10^{-3}$ and 0.1 Pa independently from the pressure in the space. Therefore, the contamination on the upper surface of the wafer caused by gas molecules can be prevented with certainty. As a result, the improvement of reflowing properties and the low resistance of aluminum can be achieved. Furthermore, the pressure in the space can be set in a range from 600 to 1300 Pa without increasing the pressure in the chamber so that the thermal conductance will be improved, thereby enhancing the cooling efficiency. In this manner, according to the present cooling step, the pressure in the chamber can be lowered while the pressure in the space between the wafer W and electrode 52 is increased, so that good cooling efficiency can be obtained while preventing contamination of the wafer.

Formation of Aluminum Layers

A layer of aluminum comprising 0.2 to 1.0 wt % of copper is first formed at high speed by sputtering to a thickness of 150 to 300 nm at not more than 200° C., more preferably 30° C. to 100° C., to form the first aluminum layer 34. The wafer is then heated within the same chamber to raise the temperature thereof to between 350° C. and 460° C., and a layer of aluminum containing copper is similarly formed at low speed by sputtering to a thickness of between 300 and 600 nm, to form a second aluminum layer 35. In this case, the "high speed" used during the formation of the aluminum layers depends on the formation conditions or design details of the device being fabricated and thus cannot be specified unconditionally. However, as a rule this means a sputtering speed of at least 10 nm/s, and "low speed" means a sputtering speed of 3 nm/s or less.

The sputtering of aluminum is performed in the sputtering apparatus, shown in FIG. 2, used when the wafer is cooled, as previously described. In this manner, by performing the cooling step and aluminum forming step in the same apparatus in which a reduced pressure is maintained, the step for transferring and installing wafers will be eliminated, resulting in the facilitation of the steps and prevention of contamination of wafers.

Here, in the sputtering apparatus shown in FIG. 2, argon gas is supplied both from the first gas supply path 53 and second gas supply path 54. The temperature at which aluminum layers are formed refers to the temperature of the wafer W (substrate temperature) controlled by the gas supplied from the second gas supply path 54.

Figure 3:
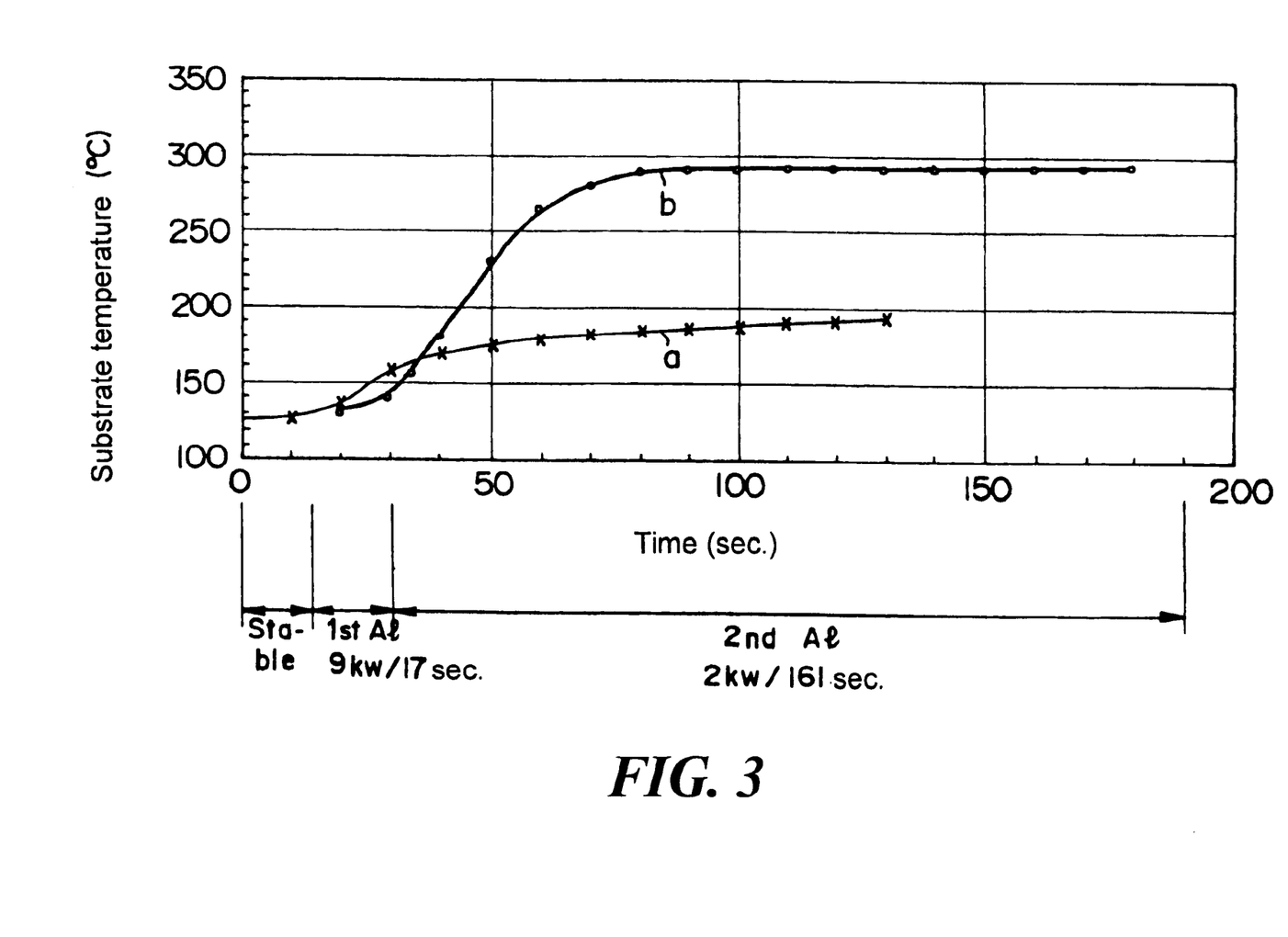
FIG. 3 is a graph of the relationship between time and substrate temperature, when the substrate temperature is controlled by the sputtering apparatus shown in FIGS. 2A and 2B.

An example of the substrate temperature controlled by using this sputtering apparatus is shown in FIG. 3. In this graph, elapsed time is plotted along the horizontal axis and substrate (wafer) temperature along the vertical axis. In FIG. 3, "a" denotes the changes in substrate temperature when the temperature of the stage 52 of the sputtering apparatus is set at 350° C., and "b" denotes the changes in substrate temperature when temperature of the stage 52 is increased by supplying argon gas through the second gas supply path 54 into the chamber.

The temperature could be controlled as described below, by way of example. First of all, the temperature of the stage 52 is previously set to the temperature for forming the second aluminum layer (350° C. to 500° C.). During the formation of the first aluminum layer, there is no supply of gas from the second gas supply path 54, so the substrate is heated by the stage 52 and thus the temperature rises gradually as shown by "a" in FIG. 3. During the formation of the second aluminum layer, the temperature of the substrate is controlled by the supply of heated gas through the second gas supply path 54 so that it rises rapidly and is held constant at a predetermined value, as shown by "b" in FIG. 3.

In the example shown in FIG. 3, the first aluminum layer 34 is formed while the stage temperature is set at 350° C. and the substrate temperature is set at between 125° C. and 150° C., and the second aluminum layer 35 is formed immediately afterwards.

Control over both the formation speed and substrate temperature during the formation of the aluminum layers is important as well as control over the power applied to the sputtering apparatus. In other words, relating to the formation speed, it is important that the power does not fall to zero while switching from high power to low power while the first aluminum layer 34 is being formed at high power and the second aluminum layer 35 is formed at low power. If the power falls to zero, an oxide layer will be formed on the surface of the first aluminum layer under the reduced pressure, causing the wettability of the second aluminum layer to deteriorate with respect to the first aluminum layer and worsening the adhesiveness therebetween. In other words, applying the power constantly ensures that active aluminum is supplied continuously to the surfaces of the aluminum layers during the formation, making it possible to suppress the formation of oxide layers. Note that the magnitude of the power depends on factors such as the sputtering apparatus and formation conditions, and thus cannot be specified unconditionally, but it is preferable to have a high power level of 5 kW to 10 kW and a low power level of 300 W to 1 kW under the temperature conditions shown in FIG. 3, by way of example.

The temperature and power can be controlled strictly by forming the first aluminum layer 34 and the second aluminum layer 35 consecutively within the same chamber in this manner, making it possible to form the aluminum layers efficiently at a lower temperature and more stably than in the conventional art.

In order to form successive layers with good step coverage, and also to suppress the escape of gaseous components from the barrier layer 33 and the BPSG layer 30 that form the interlayer dielectric underneath this aluminum layer 34, it is preferable to select an optimal range for the thickness of the first aluminum layer 34, for example, of 200 to 400 nm. For the second aluminum layer 35, the thickness is determined by factors such as the size and aspect ratio of the contact hole, so a thickness of 300 to 1000 nm is necessary for filling a hole having a diameter of 0.5 μm or less with an aspect ratio of 3.

Formation of Antireflection Layer

An antireflection layer 36 having a thickness of 30 to 80 nm is then formed by the deposition of titanium nitride by sputtering in a separate sputtering chamber. The stack consisting of the barrier layer 33, the first aluminum layer 34, the second aluminum layer 35, and the antireflection layer 36 is then selectively etched by an anisotropic dry etcher using mainly gases of $Cl_2$ and $BCl_3$, to pattern a metal wiring layer 40 therefrom.

It has been confirmed that aluminum can be embedded within a contact hole having a diameter of 0.2 to 0.8 μm and with an aspect ratio of 0.5 to 3 by the thus-formed metal wiring layer 40, with a good step coverage without creating any voids.

Experimental Example
(1) Structure of Barrier Layer and Barrier Properties
(a) Analysis of Layer Structure Using Transmission Electron Microscope (TEM)

Figure 6:
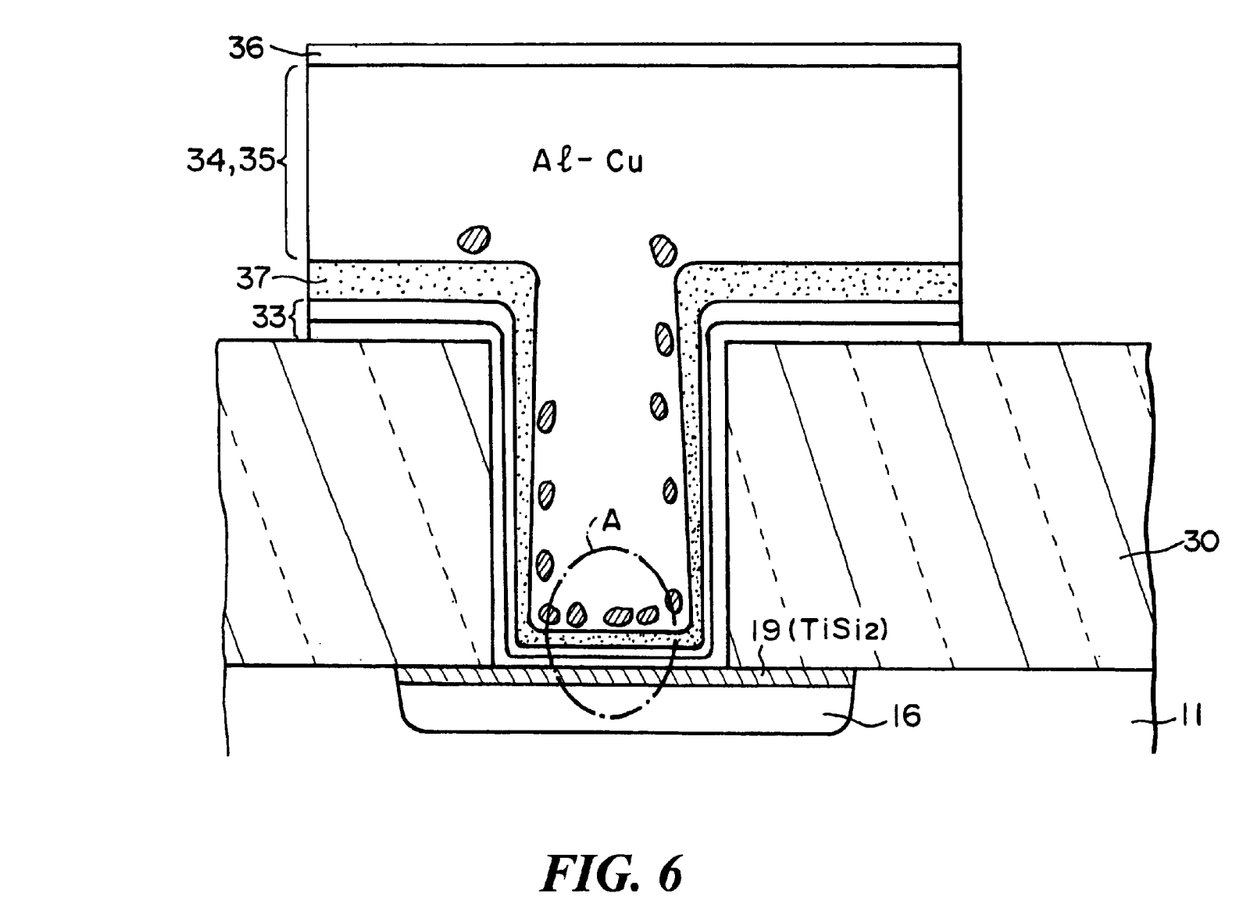
FIG. 6 is a schematic view showing a cross-sectional structure of a contact portion in the semiconductor device in accordance with the present invention.
Figure 7:
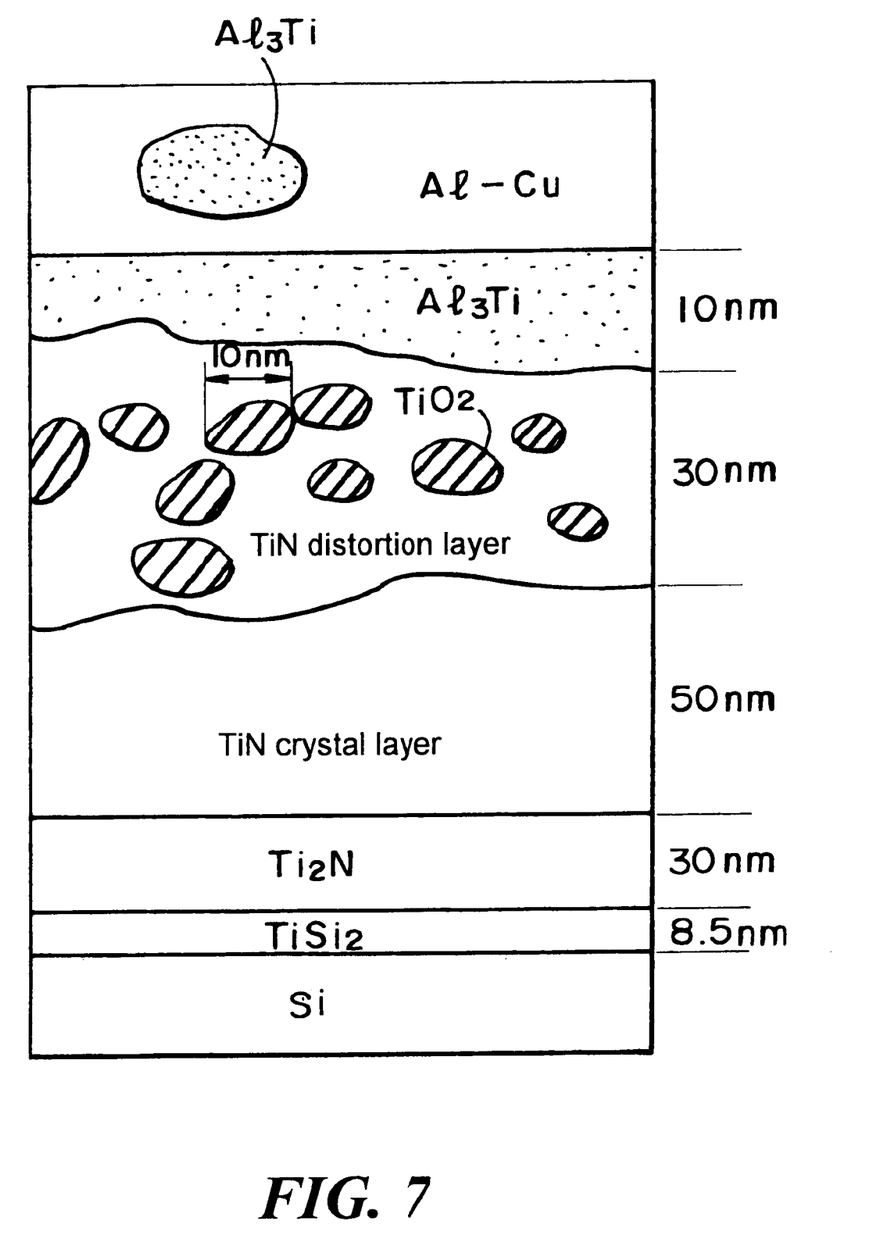
FIG. 7 is a diagram made on the basis of a micrograph of a transmission electron microscope for a cross section of the semiconductor device in accordance with the present invention.

A semiconductor device was formed as a sample with a structure shown in FIG. 1C using the method described above, and a micrograph of a cross section of a region including a contact portion was taken. The cross-sectional structure on the base of the micrograph is shown in FIG. 7 schematically. The cross-sectional structure of this contact portion is shown in FIG. 6 schematically. FIG. 7 shows the structure of a portion denoted by reference number A in FIG. 6. The sample used in this experiment was formed in the manner described below.

Firstly, as shown in FIG. 6, after the interlayer dielectric 30 was formed on the silicon substrate 11 on which an electronic element had been formed, a contact hole having a diameter of 0.3 μm was formed. Subsequently, titanium and titanium nitride layers were deposited by sputtering. Then, the wafer was exposed in oxygen plasma, and annealed in a nitrogen atmosphere at a temperature of 600° C. to form the barrier layers 33. Then, a titanium layer was formed by collimate sputtering as a wetting layer 37. The first aluminum layer 34 including copper was then formed, followed by the second aluminum layer 35 including copper. The anti reflection layer 36 comprising a titanium nitride layer was then formed by sputtering.

As shown in FIG. 7, the composition and thickness of each layer of the contact portion obtained on the basis of the micrograph from the transmission electron microscope are shown as follows.

| | |
|---|---|
| Silicon substrate (Si) | |
| Titanium silicide layer ($TiSi_2$) | 8.5 nm |
| Titanium nitride layer ($Ti_2N$; A titanium-rich layer produced by the reaction of titanium in the titanium layer and nitrogen in the titanium nitride layer) | 30 nm |
| Titanium nitride crystal layer (TiN) | Abt. 50 nm |
| Titanium nitride distortion layer (A layer in which crystal particles in $TiO_2$ are dispersed in a TiN layer) | Abt. 30 nm |
| Aluminum-titanium layer ($Al_3Ti$) | Abt. 10 nm |
| Aluminum-copper layer (Al—Cu) | |

From FIG. 7, it will be noted that crystals of titanium oxide are distributed in particulate condition in the overlying layer with a thickness of approximately 30 nm for the titanium nitride (TiN) layer forming the barrier layers 33. This titanium oxide crystal had an average particle diameter of approximately 10 nm. As the crystal particles of titanium oxide are distributed in an island-like configuration, a crystal lattice in the titanium nitride layer is distorted. This is referred to as a titanium nitride distortion layer. This titanium nitride distortion layer and the particles of titanium oxide restrain the diffusion of aluminum, thereby significantly improving the barrier properties. The material of the particles dispersed in the titanium nitride layer was determined by performing a Fourier transform for an image obtained from the transmission electron microscope and by observing the lattice image.

Further, titanium included in the wetting layer becomes an alloy of an $Al_3Ti$ system by reacting with aluminum, and the aluminum (Al—Cu) layer is formed on this wetting layer. The barrier layer does not react with the alloy of $Al_3Ti$ system and is provided with stable and excellent barrier properties and conductivity.

(b) Barrier Properties

Leak properties were checked for the sample according to the present invention and a comparison sample which is similar to the sample of the present invention except that there are no titanium oxide crystals in the barrier layer by using a transmission electron microscope and by applying heat to the samples. The leak properties, in terms of the annealing conditions when a leakage current was generated at the contact portion, were determined for the samples annealed under various conditions.

As a result, the sample of the present invention exhibited no leakage current and spike phenomenon in which aluminum extended through the barrier layer into the silicon substrate, even after the sample was subjected to annealing for 10 hours at a temperature of 550° C. On the contrary, the comparison sample was confirmed to have a leakage current on annealing for two hours at a temperature of 450° C.

From the fact described above, it was recognized that the sample according to the present invention had barrier properties superior to the comparison sample.

(2) Studies on the Influences of Degassing Step

Figure 4:
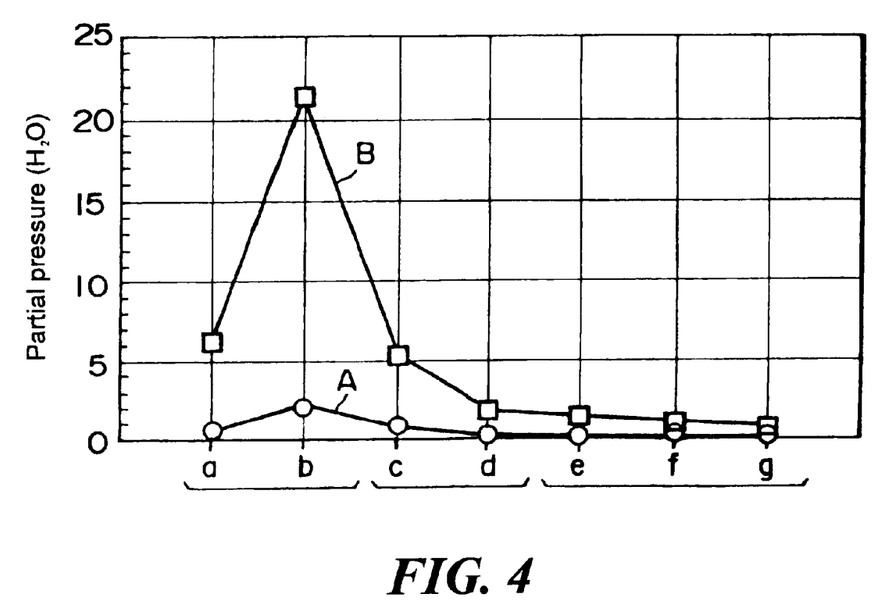
FIG. 4 shows the relationship between the process timing and partial pressure of a residual gas (water) in a chamber in the method of fabricating a semiconductor device in accordance with the present invention.
Figure 5:
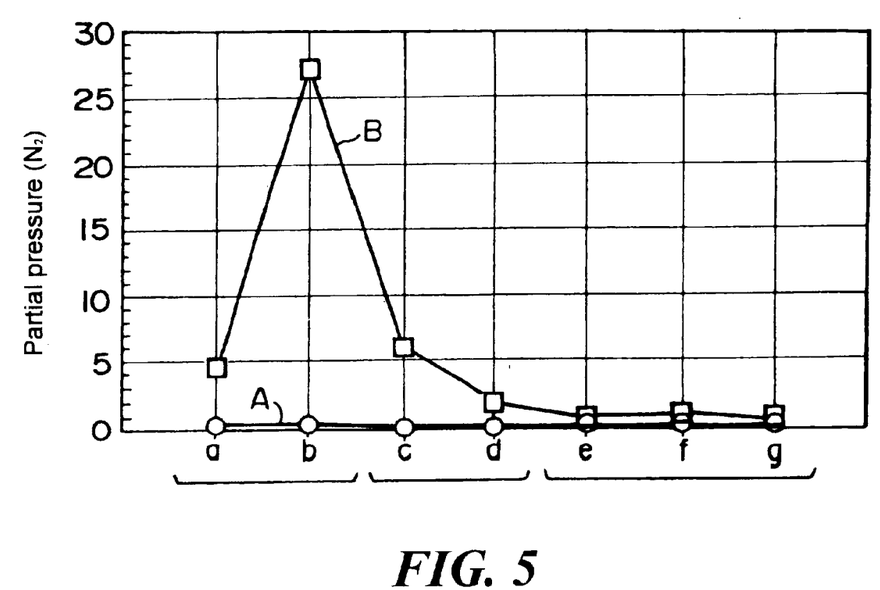
FIG. 5 shows the relationship between the process timing and partial pressure of a residual gas (nitrogen) in a chamber in the method of fabricating a semiconductor device in accordance with the present invention.

FIG. 4 and FIG. 5 show experimental results for inspecting the amount of gas (partial pressure) discharged from the wafer that differs depending on the presence of the degassing step.

In FIGS. 4 and 5, the horizontal axis shows the timing of processing from the thermal processing (thermal processing C) performed before the aluminum layer is formed through formation of the second aluminum layer 35, and the vertical axis shows the partial pressure of the residual gas in the chamber. In FIGS. 4 and 5, the line denoted by "A" shows a change in the case where the wafer is subjected to the degassing step after the interlayer dielectric is formed, and the line indicated by "B" shows a change in the case where the wafer is not subjected to the degassing step after the interlayer dielectric is formed. In this experimental example, the degassing step was performed at an air pressure of 0.1 to 1 Pa and a temperature of 460° C. for 120 seconds.

In each Figure, "a" and "b" of the horizontal axis denote the timing in the thermal processing C (in a first chamber) performed before the formation of the aluminum layer, "a" indicates the timing immediately after the wafer is inserted into the first chamber and "b" indicates the timing when the wafer is heated for 60 seconds at a temperature of 250° C. by a lamp. The air pressure in the first chamber is set under $1 \times 10^{-4}$ Pa.

In each Figure, "c" and "d" show the timing in the cooling step (in a second chamber) of the wafer, "c" designates the timing immediately after the wafer is inserted into the second chamber and "d" designates the timing when the wafer is cooled to a temperature of 20° C. The air pressure in the second chamber is set at $3\times10^{-1}$ Pa. When the partial pressure was measured, the air pressure in the chamber was reduced to $3\times10^{-6}$ Pa.

Further, "e", "f", and "g" show the timing in the aluminum layer forming step (in a third chamber). Specifically, "e" designates the timing immediately after the wafer is inserted into the third chamber, "f" designates the timing immediately after the first aluminum layer is formed, and "g" designates the timing immediately after the second aluminum layer is formed. The air pressure in the third chamber is set at $3\times10^{2}$ Pa. When the partial pressure was measured, the air pressure in the chamber was reduced to $3\times10^{-6}$ Pa.

From FIGS. 4 and 5, it was confirmed that very little water and nitrogen were generated in the thermal processing and aluminum layer forming steps by performing the degassing step after the interlayer dielectric was formed but before the barrier layer was formed. On the contrary, it will be noted that when the degassing step is not performed, a large amount of water and nitrogen are discharged in the subsequent thermal processing step, in particular, in the thermal processing C designated by "b".

The reason that the first and second aluminum layers 34 and 35 are embedded in the contact hole in an excellent manner according to the present embodiment as described above is believed to be as follows.

a. Water, hydrogen, oxygen, or nitrogen included in the interlayer dielectric, particularly, in the BPSG layer and silicon oxide layer obtained by the reaction of a silicon compound and hydrogen peroxide is gasified and discharged sufficiently by the degassing step. In addition, preventing generation of a gas from the interlayer dielectric and barrier layer 33 in the subsequent steps of forming the first aluminum layer 34 and the second aluminum layer 35 ensures increased adhesion of the barrier layer 33 and first aluminum layer 34, as well as the layer formation with good step coverage.

b. In the formation of the first aluminum layer 34, the substrate temperature is set to be a relatively low temperature at 200° C. or lower to prevent water and nitrogen included in the interlayer dielectric and barrier layer 33 from being discharged. By performing this operation in addition to the degassing step, the adhesion of the first aluminum layer 34 can further be improved.

c. Furthermore, because the first aluminum layer 34 itself restrains the generation of a gas from the lower layer when the substrate temperature is increased, the next second aluminum layer 35 can be formed at a relatively high temperature. This ensures the second aluminum layer to flow and diffuse more advantageously.

As explained above, according to the method of the present invention which comprises at least the degassing step and cooling step prior to sputtering of an aluminum layer, and forms the aluminum layer continuously in the same chamber, a contact hole having a diameter of approximately 0.2 µm can be filled with only aluminum or an aluminum alloy, resulting in the improvement in the product reliability and yield. The reliability of the device according to the present invention has also been confirmed in terms of migration or the like, with no segregation of copper or the like from the aluminum layer forming the contact portion, nor abnormal growth of crystal particles.

Furthermore, the barrier layer in the semiconductor device of the present invention contains metal oxide scattered in an island-like configuration, so that the semiconductor device has superior barrier properties while securing the conductivity in the barrier layer.

Although the present embodiment has been described for the semiconductor device including an N channel MOS element, the present embodiment can also be applied to a semiconductor device including a P channel or CMOS type element.

What is claimed is:

1. A semiconductor device, comprising:
    a semiconductor substrate including an electronic element;
    an interlayer dielectric formed on said semiconductor substrate;
    a contact hole formed in said interlayer dielectric;
    a barrier layer formed on said interlayer dielectric and said contact hole; and
    a wiring layer formed on said barrier layer,
    wherein said barrier layer includes metal oxide scattered in an island-like configuration.

2. The semiconductor device as defined in claim 1, wherein said barrier layer includes at least one substance selected from the group consisting of titanium, cobalt, tungsten, and nitrides of titanium cobalt or tungsten.

3. The semiconductor device as defined in claim 1, wherein said metal oxide included in said barrier layer has an average particle diameter between 2 nm to 20 nm.

4. The semiconductor device as defined in claim 1, wherein gaseous components of said interlayer dielectric are removed by thermal processing.

5. The semiconductor device as defined in claim 1, wherein said wiring layer is composed of aluminum or an aluminum based alloy.

6. A method of fabricating a semiconductor device comprising the steps of:
    (a) forming a contact hole in an interlayer dielectric formed on a semiconductor substrate including an electronic element;
    (b) forming a layer that is used to form a barrier layer on said interlayer dielectric and said contact hole;
    (c) forming said barrier layer by introducing oxygen into said layer that is used to form said barrier layer to cause metal oxide included in said layer to be scattered in an island-like configuration;
    (d) cooling said semiconductor substrate to 100° C. or lower;
    (e) forming a first aluminum layer made of aluminum or an aluminum based alloy at a temperature of 200° C. or lower on said barrier layer, and
    (f) forming a second aluminum layer made of aluminum or an aluminum based alloy at a temperature of 300° C. or higher on said first aluminum layer.

7. The method of fabricating a semiconductor device as defined in claim 6, wherein said layer that is used to form said barrier layer is deposited and then exposed to oxygen plasma under reduced pressure before thermal processing, to cause the metal oxide included in said layer to be scattered in an island-like configuration in said step (c).

8. The method of fabricating a semiconductor device as defined in claim 6, wherein said layer that is used to form said barrier layer is deposited and then subjected to thermal processing in an atmosphere of oxygen, to cause the metal oxide included in said layer to be scattered in an island-like configuration in said step (c).

9. The method of fabricating a semiconductor device as defined in claim 6, further comprising a degassing step in which gaseous components in said interlayer dielectric are removed by thermal processing at the substrate temperature of 300° C. to 550° C. under reduced pressure, after said step (a).

10. The method of fabricating a semiconductor device as defined in claim 6, wherein forming of aluminum layers in said steps (e) and (f) is performed by sputtering.

11. The method of fabricating a semiconductor device as defined in claim 6, wherein forming of aluminum layers in said steps (e) and (f) is performed continuously in the same chamber.

12. The method of fabricating a semiconductor device as defined in claim 6, wherein said steps (d), (e), and (f) are performed continuously in the same device having a plurality of chambers in which a reduced pressure is maintained.

13. A method of fabricating the semiconductor device of claim 1, comprising the steps of:
(a) forming the contact hole in the interlayer dielectric formed on the semiconductor substrate including the electronic element;
(b) forming the layer that is used to form the barrier layer on said interlayer dielectric and said contact hole;
(c) forming said barrier layer by introducing oxygen into said layer that is used to form said barrier layer to cause metal oxide included in said layer to be scattered in the island-like configuration; and
(d) forming a wiring layer on said barrier layer.

14. The method of claim 13, wherein said layer that is used to form said barrier layer is deposited and then exposed to oxygen plasma under reduced pressure before thermal processing, to cause the metal oxide included in said layer to be scattered in an island-like configuration in said step (c).

15. The method of claim 13, wherein said layer that is used to form said barrier layer is deposited and then subjected to thermal processing in an atmosphere of oxygen, to cause the metal oxide included in said layer to be scattered in an island-like configuration in said step (c).

16. The method of claim 13, further comprising a degassing step in which gaseous components in said interlayer dielectric are removed by thermal processing at the substrate temperature of 300° C. to 550° C. under reduced pressure, after said step (a).

17. The method of claim 13, wherein the step of forming a wiring layer on said barrier layer comprises the steps of:
(e) cooling said semiconductor substrate to 100° C. or lower;
(f) forming a first aluminum layer made of aluminum or an aluminum based alloy at a temperature of 200° C. or lower on said barrier layer, and
(g) forming a second aluminum layer made of aluminum or an aluminum based alloy at a temperature of 300° C. or lower on said first aluminum layer.

18. The method of claim 17, wherein forming of aluminum layers in said steps (f) and (g) is performed by sputtering.

19. The method of claim 17, wherein forming of aluminum layers in said steps (f) and (g) is performed continuously in the same chamber.

20. The method of claim 17, wherein said steps (e), (f) and (g) are performed continuously in the same device having a plurality of chambers in which a reduced pressure is maintained.

* * * * *